(12) United States Patent
Falk et al.

(10) Patent No.: US 9,594,126 B2
(45) Date of Patent: Mar. 14, 2017

(54) DISTRIBUTED DETECTION OF LEAKAGE CURRENT AND FAULT CURRENT, AND DETECTION OF STRING FAULTS

(71) Applicant: SMA Solar Technology AG, Niestetal (DE)

(72) Inventors: Andreas Falk, Kassel (DE); Mario Willenberg, Kassel (DE)

(73) Assignee: SMA SOLAR TECHNOLOGY AG, Niestetal (DE)

( * ) Notice: Subject to any disclaimer, the term of this patent is extended or adjusted under 35 U.S.C. 154(b) by 108 days.

(21) Appl. No.: 14/607,151

(22) Filed: Jan. 28, 2015

(65) Prior Publication Data
US 2015/0137850 A1    May 21, 2015

Related U.S. Application Data

(63) Continuation of application No. PCT/EP2013/065182, filed on Jul. 18, 2013.

(30) Foreign Application Priority Data

Aug. 3, 2012 (DE) .................. 10 2012 107 126

(51) Int. Cl.
*G01R 31/40* (2014.01)
*G01R 19/00* (2006.01)
(Continued)

(52) U.S. Cl.
CPC ........... *G01R 31/40* (2013.01); *G01R 31/025* (2013.01); *H01L 31/02021* (2013.01);
(Continued)

(58) Field of Classification Search
CPC . H01L 31/02021; G11C 29/021; G11C 29/12; G11C 5/147; H02S 50/10;
(Continued)

(56) References Cited

U.S. PATENT DOCUMENTS

| 2002/0105765 A1 | 8/2002 | Kondo et al. |
| 2011/0210610 A1 | 9/2011 | Mitsuoka et al. |

(Continued)

FOREIGN PATENT DOCUMENTS

| EP | 2372857 A1 | 10/2011 |
| WO | 2011026874 A2 | 3/2011 |

OTHER PUBLICATIONS

International Search Report dated Nov. 28, 2013 for International Application No. PCT/EP2013/065182.

(Continued)

*Primary Examiner* — Vinh Nguyen
(74) *Attorney, Agent, or Firm* — Eschweiler & Associates, LLC (57) ABSTRACT

For monitoring an inverter that includes separate input-side connectors for multiple direct-current generators with regard to the occurrence of a critical fault current, differential currents in at last two pairs of input lines are measured separately in the inverter. The at last two pairs of input lines conduct the currents that are fed in at different input-side connectors, and all pairs of input lines in their entirety transmit all currents that are fed in at the connectors. The differential currents are compared with a limit value separately for each pair of input lines. A case of the limit value being exceeded is recognized as a fault. In addition, a sum of simultaneously occurring differential currents in all pairs of input lines is determined and the sum is compared with a further limit value, wherein a case of the further limit value being exceeded is also recognized as a fault.

21 Claims, 4 Drawing Sheets

(51) Int. Cl.
G01R 31/02 (2006.01)
H02H 3/33 (2006.01)
H01L 31/02 (2006.01)
H02S 50/10 (2014.01)
H02H 7/122 (2006.01)
H02H 7/20 (2006.01)

(52) U.S. Cl.
CPC ............ *H02H 3/337* (2013.01); *H02H 7/122* (2013.01); *H02S 50/10* (2014.12); *H02H 7/20* (2013.01); *Y02E 10/50* (2013.01)

(58) Field of Classification Search
CPC ....... H02S 40/36; H02S 50/00; G01R 31/025; G01R 31/02; G01R 31/1227; G01R 31/31706; G01R 17/02; G01R 31/333; H02M 1/32; H02M 7/42; G01H 13/00
See application file for complete search history.

(56) References Cited

U.S. PATENT DOCUMENTS

| 2011/0216452 | A1* | 9/2011 | Haines | H02H 3/00 361/42 |
|---|---|---|---|---|
| 2012/0048326 | A1 | 3/2012 | Matsuo et al. | |
| 2012/0049627 | A1 | 3/2012 | Matsuo et al. | |
| 2013/0043880 | A1 | 2/2013 | Bettenwort et al. | |
| 2013/0154380 | A1 | 6/2013 | Willer | |

OTHER PUBLICATIONS

English translatioon of the relevant pages of "Sicherheitsrelevante Aspekte bei PV-Anlagen" cited in the International Search Report.
Anonymous: "Sicherheitsrelevante Aspekte bei PV-Anlagen", Dec. 1, 2010 (Dec. 1, 2010), pp. 50-55 (URL: http://www.bender-regenerative.com/fileadmin/bender-de/downloads/article/DE_22_10_GT11.pdf).
Anonymous: Sunny Boy 5000TL Multi-String Transformerless Solar Inverter for Three Independent Strings. Jan. 1, 2006 (Jan. 1, 2006), pp. 1-60.
English translatioon of the relevant pages of "Fehlermeldung "Ableitstrom zu groβ"" cited in the International Search Report.
Photovoltaic Forum: "Fehlermeldung "Ableitstrom zu groβ"" Aug. 27, 2011 (Aug. 27, 2011) (URL: http://www.photovoltaikforum.com/stoerungen-auffaelligkeiten-im-betrieb-von-pv-anla-f99/fehlermeldung-ableitstrom-zu-gros-t67510.html).

* cited by examiner

DISTRIBUTED DETECTION OF LEAKAGE CURRENT AND FAULT CURRENT, AND DETECTION OF STRING FAULTS

REFERENCE TO RELATED APPLICATIONS

This application is a continuation of International Application number PCT/EP2013/065182 filed on Jul. 18, 2013, which claims priority to German Application number 10 2012 107 126.8 filed on Aug. 3, 2012.

FIELD

The present disclosure relates to a method of monitoring an inverter that comprises separate input-side connectors for multiple direct-current generators with regard to the occurrence of a critical leakage current. Furthermore, the present disclosure relates to an inverter for performing such a method.

BACKGROUND

US 2011/0210610 A1 discloses a photovoltaic system that comprises a plurality of parallel-connected photovoltaic generators. The parallel connection is performed in groups, in that initially individual photovoltaic generators are combined to form connection units and the currents of several of these connection units are then combined in one collection unit prior to said currents being directed to an inverter. A fault monitoring procedure is performed in the connection units for each individual photovoltaic generator but said procedure is not especially directed at detecting a ground fault or measuring the differential current.

US 2012/0048326 A1 discloses a photovoltaic system wherein a plurality of photovoltaic generators are parallel-connected in groups as in the latterly discussed prior art. In this system, the differential current is measured for each individual photovoltaic generator in a connection unit in order to monitor the photovoltaic generator to detect the occurrence of a ground fault. A further differential current measurement is performed in a common inverter for the direct current of all photovoltaic generators in order also to monitor the lines between the differential current sensors of the individual photovoltaic generators and the inverter with regard to the occurrence of a ground fault. US 2012/0049627 A1 also discloses such a monitoring with regard to the occurrence of a ground fault for of a photovoltaic system.

US 2002/0105765 A1 discloses a photovoltaic system wherein the fault current portion of a differential current in input lines of a photovoltaic inverter is determined by taking into consideration the actual capacity of the connected photovoltaic generator and by taking into consideration the potential fluctuations at the input lines with respect to ground in order to be able to monitor said fault current portion reliably with regard to the occurrence of small step changes even in the case of large variable capacitive leakage current portions in the differential current.

WO 2011/026874 A2 discloses a method for monitoring a plurality of photovoltaic generators of a photovoltaic system, which are denoted here as strings, in order to be able to recognize, for example, a partial failure of even only one substring of a photovoltaic generator at an early stage. For this purpose, currents of the individual strings are measured and simultaneously occurring currents are placed in relation to one another and the long term progression of these relationships is evaluated.

There still is a need of a method of monitoring an inverter with regard to the occurrence of a critical fault current and to provide an inverter that is suitable for performing such a method, said method and inverter rendering it possible even in the case of a high electric power output and a corresponding high capacity of connected photovoltaic generators to detect small short-term increases in the fault current just as reliably as absolute values of the entire differential current that is flowing in the inverter or of a specific current portion of this differential current.

SUMMARY

The present disclosure provides a method of monitoring an inverter that comprises separate input-side connectors for multiple direct-current generators with regard to the occurrence of a critical fault current. In the method, within the inverter, all currents that are fed in at the individual input-side connectors are transmitted via at least two pairs of input lines that are separately conducting the currents that are fed in at different input-side connectors. Further, also within the inverter, differential currents between the input lines are measured separately for each of the at least two pairs of input lines. The differential currents are compared with a limit value separately for each of the at least two pairs of input lines, wherein a case of the limit value being exceeded is recognized as a fault. Additionally, a sum of the differential currents simultaneously occurring in all of the at least two pairs of input lines is determined; and the sum is compared with a further limit value, wherein a case of the further limit value being exceeded is likewise recognized as a fault.

The present disclosure further provides an inverter comprising separate input-side connectors for multiple direct-current generators, at least two pairs of input lines, measuring devices, and a monitoring device. The at least two pairs of input lines are configured to separately conduct the currents that are fed in at different input-side connectors, and all of the at least two pairs of input lines together are configured to transmit all currents that are fed in at the individual input-side connectors. The measuring devices are configured to measure the differential currents between input lines separately for each of the at least two pairs of input lines, and comprise a separate differential current sensor for each of the at least two pairs of input lines. The monitoring device is configured to compare the differential currents with a limit value separately for each of the at least two pairs of input lines, and to recognize a case of the limit value being exceeded as a fault. Additionally, the monitoring device is configured to determine a sum of the differential currents that are measured by means of all differential current sensors, and to compare said sum with a further limit value, and to likewise recognize a case of the further limit value being exceeded as a fault.

The present disclosure further provides a method of monitoring an inverter that comprises separate input-side connectors for multiple direct-current generators with regard to the occurrence of a critical fault current. In the method, within the inverter, all currents that are fed in at the individual input-side connectors are transmitted via at least two pairs of input lines that are separately conducting the currents that are fed in at different input-side connectors. Further, also within the inverter, differential currents between the input lines are measured separately for each of the at least two pairs of input lines. A sum of the differential currents simultaneously occurring in all of the at least two pairs of input lines is determined; and the sum is compared with a limit value, wherein a case of the limit value being exceeded is recognized as a fault.

Other features and advantages of the present disclosure will become apparent to one with skill in the art upon examination of the following drawings and the detailed description. It is intended that all such additional features and advantages be included herein within the scope of the present disclosure, as defined by the claims.

BRIEF DESCRIPTION OF THE DRAWINGS

The present disclosure can be better understood with reference to the following drawings. The components in the drawings are not necessarily to scale, emphasis instead being placed upon clearly illustrating the principles of the present disclosure. In the drawings, like reference numerals designate corresponding parts throughout the several views.

DETAILED DESCRIPTION

The present disclosure relates in particular to the monitoring of a photovoltaic inverter with regard to the occurrence of a critical leakage current that represents an indication of a ground fault. In the case of a differential current that is measured across the connection lines of a photovoltaic generator, there also occurs in addition to the fault current portion of interest a very high capacitive leakage current portion that renders it difficult to monitor the resistive fault current portion with regard to, for example, the occurrence of step changes that are small in comparison to the leakage current portion. The high leakage current portion is caused by the high capacity of photovoltaic generators with respect to ground. This capacity manifests itself in a high leakage current as soon as the input lines of an inverter are exposed during its operation to potential displacements with respect to ground.

In the case of transformerless inverters and other inverters without galvanic isolation between direct-current input and alternating-current output, it is also possible that hazardous resistive fault currents can occur even in the case of only one ground fault on the direct-current input side. In other words, even a simple ground fault does not only lead to an input line being (undesirably) grounded. It is therefore a requirement in the case of transformerless inverters that they must be reliably monitored with regard to the occurrence of fault currents. In doing so, two criteria have to be considered. On the one hand, the resistive fault current portion must not experience any step changes, in other words no rapid increases above a comparatively low limit value of for example 30 mA in order to ensure a maximal protection against personal injury. On the other hand, in order to provide fire protection and plant protection, a total differential current that occurs or also its capacitive leakage current portion or its absolute resistive leakage current portion must not exceed a considerably higher limit value of some 100 mA. Moreover, this higher limit value increases with the total power output of the respective photovoltaic system, which does not apply for the lower limit value of the short-term increase in the resistive leakage current portion.

In the case of particularly large photovoltaic systems, it is particularly difficult to extract from a measured differential current the resistive leakage current portion with sufficient accuracy in order to monitor it to ensure that it adheres to the low limit value for short-term increases.

According to the present disclosure, in the method of monitoring an inverter that comprises separate input-side connectors for multiple direct-current generators, in particular photovoltaic generators, with regard to the occurrence of a critical fault current, differential currents are measured in the inverter separately in at least two pairs of input lines that conduct the currents that are fed in at different input-side connectors, wherein all pairs of input lines together, in other words in their entirety conduct all currents that are being fed in at the connectors. The differential currents are compared for each pair of input lines separately with a limit value, wherein in the case of the limit value being exceeded, this is recognized as a fault. In addition, a sum of simultaneously occurring differential currents in all pairs of input lines is determined and the sum is compared with a further limit value, wherein in the case of the further limit value being exceeded this is also recognized as a fault.

In order to perform the method in accordance with one embodiment of the present disclosure, differential currents are measured in the inverter itself. Although the opportunity exists to use a single differential current sensor to measure the entire differential current that is flowing in the inverter, it is proposed in accordance with the present disclosure to use for this purpose at least two differential current sensors and the differential current sensors monitor with regard to the occurrence of differential currents in each case only those currents that are flowing from a subset of the direct-current generators. As a consequence, the capacitive leakage current portions of the measured differential currents are reduced with respect to a single differential current measurement that is performed over the entirety of the direct-current generators. If, for example, each of two differential current sensors detects the currents from half of all direct-current generators, the absolute values of the capacitive leakage current portions of the differential currents are halved. Accordingly, the respective capacitive leakage current portion can be further reduced using an even higher number of differential current sensors. Consequently, the sensitivity when monitoring the respective differential current with regard to the occurrence of a small short-term increase in its fault current portion is increased. This sensitivity can be increased to such an extent that the differential currents that are measured with each individual differential current sensor can be monitored directly with regard to the occurrence of abrupt increases, in other words without isolating a capacitive leakage current portion before, or without in any other way extracting the pure resistive fault current portion. The increase in sensitivity concerning small increases in the resistive fault current portion of the entire current that is flowing in the inverter is achieved by means of the usual plural number of differential current sensors in the inverter. However, in the case of the present disclosure, the absolute value of the differential current of interest or of its current portions is also detected by means of the corresponding sum of the signals of the individual differential current sensors, and can be compared accordingly with the allocated limit value that applies for the respective photovoltaic system as a whole. This yields distinct advantages by virtue of the fact that this limit value is allocated not to the individual differential current sensors but rather the respective sum is compared with the limit value, since this limit value is adhered to by the entire photovoltaic system and if only one portion of the limit value were to be exceeded at one single of the differential current sensors it would lead to the entire photovoltaic system being switched off unnecessarily.

As has already been mentioned, the limit value with which the differential currents for each pair of input lines are compared separately is usually a limit value for each current increase within a specific period of time. To be specific, this limit value usually applies for a resistive fault current portion of the differential currents. As already mentioned, it is therefore possible to determine the resistive fault current portion of each of the measured differential currents and each of the measured differential currents can be compared in the form of its resistive fault current portion with the limit value for the resistive fault current portion of the differential currents. Even if it is advantageous, it is, however, not absolutely mandatory to determine the resistive fault current portions separately. Rather the measured differential currents can be compared with the limit value, as long as the further portions in particular a capacitive leakage current portion of the differential currents remain small.

The further limit value with which the sum of simultaneously occurring differential currents in all pairs of input lines is compared can be a limit value for the direct sum of the differential currents or can be a limit value for a sum of the capacitive leakage current portions of the differential currents. The sum of the capacitive leakage current portions of the differential currents can also be determined as the capacitive leakage current portion of the sum of the differential currents in this case. For each of the measured differential currents its capacitive leakage current portion can thus be determined; and the sum of simultaneously occurring differential currents in all pairs of input lines can be determined in the form of the sum of their capacitive leakage current portions and can be compared with the further limit value. Alternatively, the sum of the simultaneously occurring differential currents in all pairs of the input lines can be determined in the form of a capacitive leakage current portion of the sum of the simultaneously occurring differential currents and can be compared with the further limit value.

Generally, it is also possible for the further limit value to be a limit value for a sum of the resistive fault current portions of the differential currents or to be a limit value for a resistive fault current portion of the sum of the differential currents.

Methods of determining the resistive fault current portion and reversely also for determining the capacitive leakage current portion of a differential current, as can also be applied here, are known for example from EP 2 372 857 A1 and DE 10 2011 002 084 A1.

Each pair of input lines that are monitored using one of the differential current sensors can conduct the currents that are fed in at the connectors for at least two direct-current generators. In other words, in the case of the present disclosure, it is not necessary to provide a dedicated direct-current sensor for each individual direct-current generator. Rather, direct-current generators to be monitored using a single differential current sensor can be combined as long as it is ensured that even a small but relevant increase in the fault current portion of the differential current is reliably recognized.

In the case of recognizing a fault on the basis of the differential currents detected by each of the differential current sensors or on the basis of the sum of the differential currents, the inverter is switched off and/or disconnected from an AC grid that is connected on the output-side, the latter procedure occurs in particular if the inverter is not galvanically isolated from the AC grid.

If a fault is recognized at one pair of input lines of the inverter, these input lines can also be disconnected selectively or the allocated connectors and accordingly the direct-current generators connected thereto can be switched off.

The measurement in accordance with the present disclosure of the differential currents by way of subsets of the direct-current generators that are connected to the inverter also render it possible to monitor these subsets separately from one another with regard to the occurrence of faults in terms of a failure of individual direct-current generators or individual substrings of photovoltaic generators as direct-current generators. Any drop in the differential current in a pair of input lines can be valuated directly as an indication that a failure has occurred in one of the direct-current generators that is connected thereto. As a result of the failure of one of the photovoltaic generators, for example as a result of fusing of both safety fuses that protect the photovoltaic generator, the capacitive leakage current portion of the photovoltaic generator ceases to occur in the differential current. However, even in the case of fusing one of these safety fuses, a reduction occurs in the capacitive leakage current portion of the differential current.

This ceasing to occur or this reduction of the capacitive leakage current portion can be recognized particularly easily if simultaneously occurring differential currents in all pairs of input lines are compared, in other words, if the differential currents that are measured using the individual differential current sensors are compared. As a consequence, it is possible to allocate to external events any changes that occur simultaneously for all differential currents and to separate the changes from actual failures of individual direct-current generators that affect the differential currents being measured by an individual differential current sensor.

In addition, it is possible to evaluate long term characteristics of differential currents and in particular their relationships with one another. Generally, it is possible to use the same algorithms as are known from WO 2011/026874 A2, the content of which is included here in this respect. In accordance with WO 2011/026874 A2, the respective string current, in other words a differential-mode current is observed, whereas in the case of the present disclosure the differential current, in other words a common mode current, is observed.

In the case of an inverter in accordance with the present disclosure for performing the method in accordance with the present disclosure, the inverter comprising separate input-side connectors for multiple direct-current generators, measuring devices that measure the differential currents between input lines that in their entirety conduct all currents that are fed in at the connectors and the inverter comprising a monitoring device that compares the differential currents with a limit value and in the case of the limit value being exceeded recognizes this as a fault, the measuring devices comprise a separate differential current sensor for each of at least two pairs of input lines, wherein these at least two pairs of input lines conduct the currents that are fed in at different input-side connectors. The differential currents that are measured by each of the differential current sensors are compared separately with the limit value by the monitoring device. Furthermore, the monitoring device determines in addition a sum of differential currents that are measured simultaneously by all differential current sensors and compares this sum with a further limit value. Also in the case of this further limit value being exceeded the monitoring device recognizes this as a fault.

All embodiments of the method in accordance with the present disclosure have their equivalent in the case of the inverter in accordance with the present disclosure since the method is performed completely in the inverter.

Figure 1:
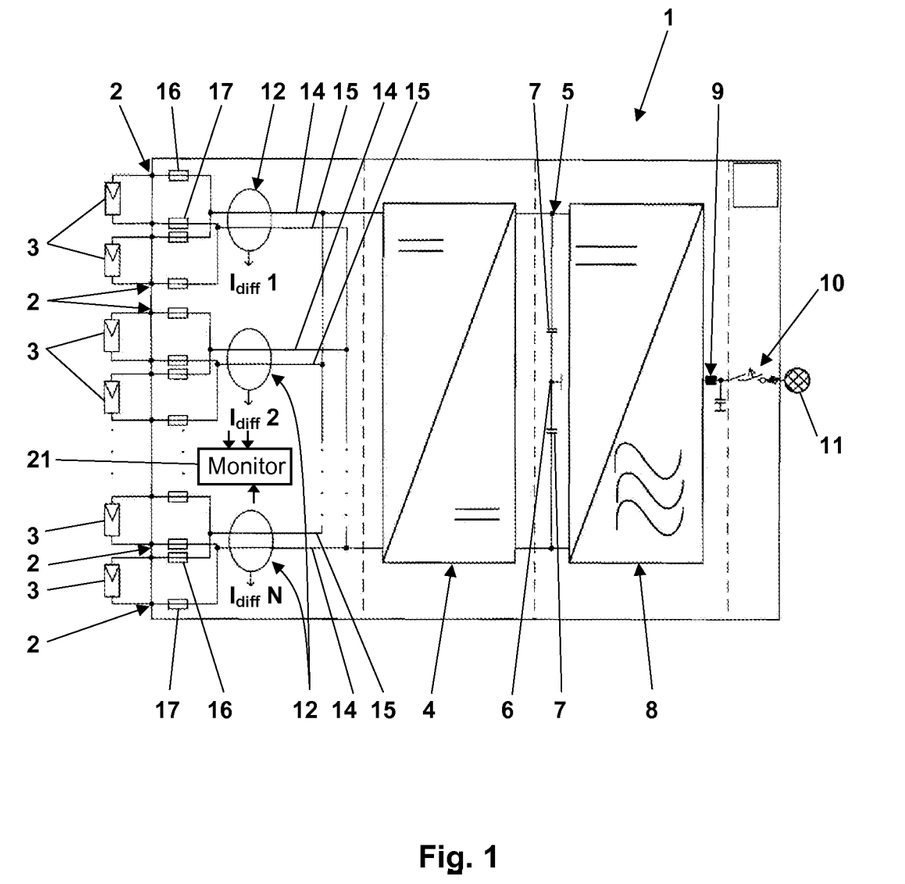
FIG. 1 illustrates an inverter in accordance with the present disclosure between a plurality of photovoltaic generators and an AC grid.

Now referring in greater detail to the drawings, the inverter 1 that is illustrated in FIG. 1 comprises multiple connectors 2 for in each case a photovoltaic generator 3 as a specific example for a direct-current generator. The photovoltaic generators 3 are parallel connected in groups in the inverter 1 so that their output voltages are identical in each case and correspond to an input-side intermediate circuit voltage of an input-side DC/DC converter 4 of the inverter 1. This DC/DC converter 4 establishes an intermediate circuit voltage at the DC-voltage intermediate circuit 5 that is embodied here by way of example with a grounded mid-point 6 and two capacitors 7 that feed in to an in this case three-phase DC/AC converter 8 in the inverter 1. The DC/AC converter 8 is connected via a mains filter 9 and a mains switch 10 to an AC grid 11. In order to monitor the inverter 1 with regard to the occurrence of critical fault currents that provide an indication that a ground fault has occurred in the region of the photovoltaic generators 3 and their parallel connection, multiple differential current sensors 12 are provided and said sensors are used to detect in each case the differential current in a pair of input lines 14, 15. These input lines 14, 15 conduct in this case the current from in each case two photovoltaic generators, wherein it is also possible to connect even more photovoltaic generators to each pair of input lines 14,15 but also to connect only one single photovoltaic generator 3. By means of a monitoring device 21, the differential current $I_{diff}$ that is measured by each of the differential current sensors 12 is subsequently monitored separately from the other differential currents with respect to whether said differential current $I_{diff}$ has rapidly increased above a limit value. This monitoring process can be performed directly on the differential current $I_{diff}$ or on its resistive fault current portion $I_R$.

Figure 4:
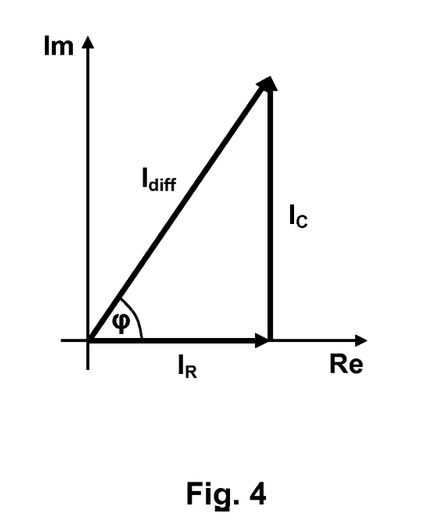
FIG. 4 illustrates the relationships between a measured fault current $I_{diff}$ and its resistive fault current portion $I_R$ as well as its capacitive leakage current portion $I_C$.

This resistive fault current portion is the real part of the differential current $I_{diff}$, in other words the current that is in phase with the voltage. In contrast thereto, a capacitive leakage current portion $I_C$ is the imaginary part of the differential current $I_{diff}$ that has a phase offset of 90° with respect to the voltage. These relationships are illustrated in FIG. 4. It is evident in FIG. 4 that a large capacitive leakage current portion $I_C$ makes it difficult to recognize by means of observing the absolute value or the phase angle $\phi$ of the differential current $I_{diff}$ an increase in the resistive fault current portion $I_R$ that in absolute terms is much smaller but still relevant.

By virtue of the fact that the differential current $I_{diff}$ in the case of the photovoltaic system in FIG. 1 is allocated in the inverter 1 to multiple differential current sensors 12, the capacitive leakage current that results from the large capacities of the photovoltaic generators with respect to ground is reduced to approximately 1/N for each differential current sensor, wherein N represents the number of differential current sensors. Accordingly, the sensitivity in the case of monitoring the entire differential current with regard to recognizing a relevant increase in the fault current portion $I_R$ is improved by a factor N.

At the same time, in the case of the photovoltaic system in FIG. 1, the sum of the differential currents $\Sigma I_{diff}$ i is determined, wherein $I_{diff}$ i with i from 1 to N are the differential currents of the individual different current sensors 12, and are compared with a further limit value. This can be done by means of directly comparing the sum $\Sigma I_{diff}$ i with the further limit value. However, it is also possible to compare a current portion of the sum of the measured differential currents $I_{diff}$ with the further limit value. This current portion of the sum of the measured differential currents $I_{diff}$ can be determined from the sum $\Sigma I_{diff}$ i itself or as a sum of the corresponding current portions of the individual differential currents $I_{diff}$ i. At the same time, the current portion in one embodiment can also be the capacitive leakage current portion $I_C$ instead of the fault current portion $I_R$.

Figure 2:
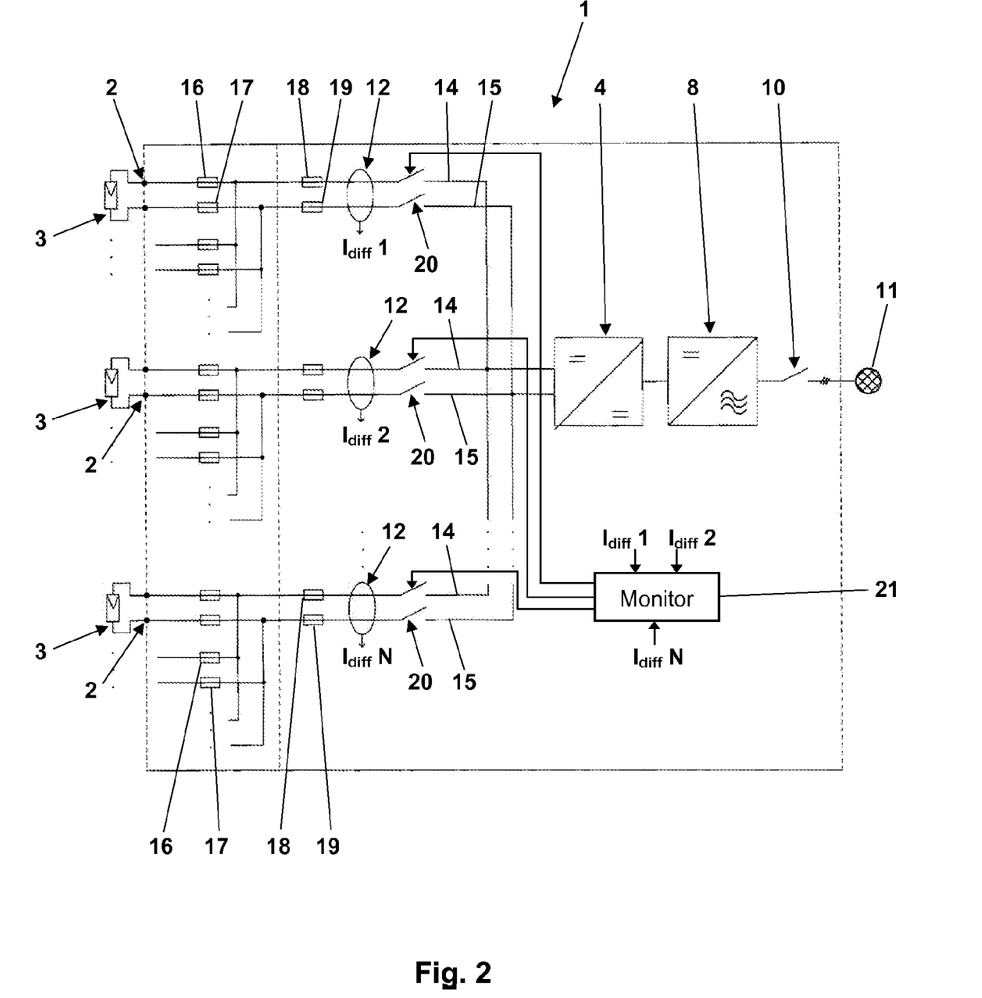
FIG. 2 illustrates a modification of the inverter of FIG. 1.

In the case of the photovoltaic system illustrated in FIG. 2, N differential current sensors 12 are provided in the inverter 1 and the differential current sensors are used to detect in each case the differential current $I_{diff}$ of three or more photovoltaic generators 3, the differential current flowing in a pair of input lines 14, 15. While in FIG. 1 the photovoltaic generators 3 are in each case protected in the inverter 1 individually by means of a pair of fuses 16, 17, in this case additional fuses 18, 19 are arranged in the input lines 14 and 15. The fuses 16 and 17 can be arranged in this case also outside the inverter 1, for example in a connection unit, by which the multiple photovoltaic generators 3 are connected in parallel to a pair of input lines 14 and 15 prior to being connected to the connectors 2 of the inverter 1. In addition, each pair of input lines 14, 15 can be disconnected individually by means of a switch 20. With such a disconnection it is possible to react on a critical increase in the resistive fault current portion of the differential current $I_{diff}$ i in an individual pair of input lines 14 and 15, wherein the critical increase is recognized by the monitoring device 21 via only one of the differential current sensors 12. If, on the other hand, the sum of the differential currents $\Sigma I_{diff}$ i exceeds the further limit, it is in fact also possible to attempt to eliminate its largest summand by the monitoring device 21 opening one of the switches 20, however, it would then also be necessary to reduce the further limit value for the remaining sum proportionally. It is therefore usually necessary to open the mains switch 10 and to switch off the inverter 1, in particular its DC/AC converter 8, if the further limit value for the sum of the differential currents $\Sigma I_{diff}$ i is exceeded.

Figure 3:
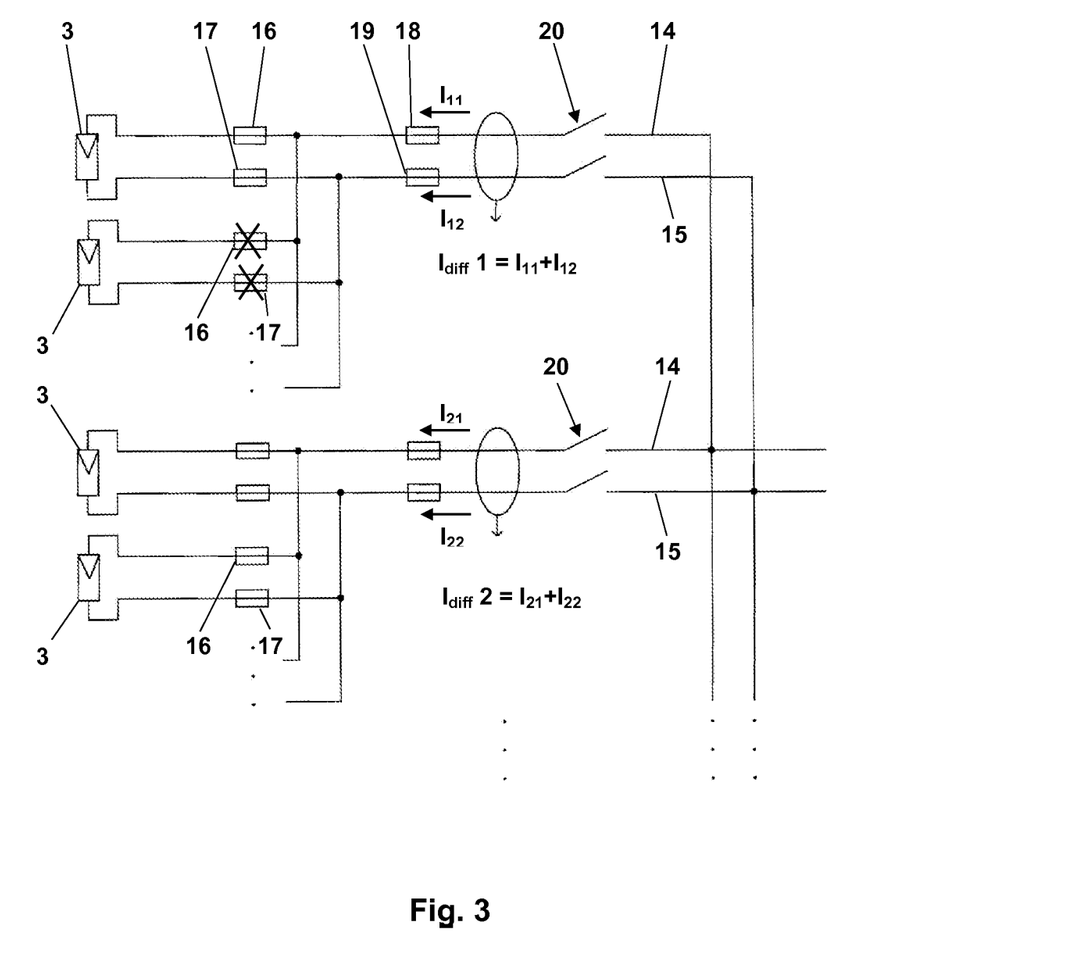
FIG. 3 illustrates a detail of the inverter of FIG. 2 in the case of a failure of one of the photovoltaic generators.

FIG. 3 illustrates that the differential currents $I_{diff}$ can also be used for the purpose of detecting failures of individual photovoltaic generators. By way of example, in this case, two fuses 16 and 17 of the second photovoltaic generator 3 are tripped, so that the photovoltaic generator 3 is no longer connected to the input lines 14 and 15. As a consequence, the leakage capacity of the second photovoltaic generator 3 falls away and consequently a considerable part of the capacitive leakage current portion of the fault current $I_{diff}$ 1. However, the capacitive leakage current portion of the fault current $I_{diff}$ 1 is also reduced even if only one of the fuses 16 and 17 is tripped. Even if this reduction is less than if both the fuses 16 and 17 are tripped, the reduction is significant when comparing the differential current $I_{diff}$ 1 with the differential current $I_{diff}$ 2 that is measured at the same time for photovoltaic generators 3 that have not failed.

Many variations and modifications may be made to the various embodiments of this disclosure without departing substantially from the spirit and principles of this disclosure. All such modifications and variations are intended to be included herein within the scope of the present disclosure, as defined by the following claims.

The invention claimed is:

1. A method of monitoring an inverter that comprises separate input-side connectors for respective multiple direct-current generators when coupled thereto with regard to the occurrence of a critical fault current, comprising:

transmitting within the inverter all currents that are fed in at the individual input-side connectors via at least two pairs of input lines that are separately conducting the currents that are fed in at different input-side connectors;

measuring within the inverter differential currents between the input lines separately for each of the at least two pairs of input lines using one or more measuring devices;

comparing the differential currents with a limit value separately for each of the at least two pairs of input lines, wherein a case of the limit value being exceeded is recognized as a fault using a monitoring device;

additionally determining a sum of the differential currents simultaneously occurring in all of the at least two pairs of input lines using the monitoring device; and comparing the sum with a further limit value, wherein a case of the further limit value being exceeded is likewise recognized as a fault using the monitoring device.

2. The method of claim 1, wherein the limit value with which the differential currents are compared separately for each of the at least two pairs of input lines is a limit value for a current increase within a specific period of time.

3. The method of claim 1, wherein the limit value with which the differential currents are compared separately for each of the at least two pairs of input lines is a limit value for an increase of a resistive fault current portion of the differential currents.

4. The method of claim 3, wherein the resistive fault current portion of the measured differential currents is determined separately for each of the measured differential currents, and wherein the resistive fault current portion of each of the measured differential currents is compared with the limit value.

5. The method of claim 1, wherein the further limit value with which the sum of simultaneously occurring differential currents in all of the at least two pairs of input lines is compared is a limit value for a sum of the capacitive leakage current portions of the differential currents.

6. The method of claim 5, wherein the capacitive leakage current portion of the measured differential currents is determined separately for each of the measured differential currents and the sum of the capacitive leakage current portions of the simultaneously occurring differential currents in all of the at least two pairs of the input lines is compared with the further limit value.

7. The method of claim 5, wherein a capacitive leakage current portion of the sum of the simultaneously occurring differential currents in all of the at least two pairs of the input lines is compared with the further limit value.

8. The method of claim 1, wherein each of the at least two pairs of input lines conducts the currents that are fed in at the connectors from at least two direct-current generators when coupled thereto, respectively.

9. The method of claim 1, wherein, in the case of a fault being recognized, at least one of the following steps is taken:
switching off the inverter;
disconnecting the inverter from an AC grid that is connected on the output-side.

10. The method of claim 1, wherein, in the case of a fault being recognized at only one of the at least two pairs of input lines, these input lines are selectively disconnected or the allocated connectors are selectively switched off.

11. The method of claim 1, wherein a drop in the differential current in one of the at least two pairs of input lines is recognized as an indication of a failure of a direct-current generator that is connected thereto.

12. The method of claim 1, wherein the simultaneously occurring differential currents in the at least two pairs of input lines are additionally compared with one another.

13. The method of claim 12, wherein additionally long term characteristics of differential currents in the at least two pairs of input lines are evaluated.

14. An inverter comprising:
separate input-side connectors for multiple direct-current generators;
at least two pairs of input lines configured to separately conduct the currents that are fed in at different input-side connectors, all of the at least two pairs of input lines together being configured to transmit all currents that are fed in at the individual input-side connectors;
measuring devices configured to measure the differential currents between input lines separately for each of the at least two pairs of input lines, wherein the measuring devices comprise a separate differential current sensor for each of the at least two pairs of input lines; and
a monitoring device configured to compare the differential currents with a limit value separately for each of the at least two pairs of input lines, and to recognize a case of the limit value being exceeded as a fault,
wherein the monitoring device is additionally configured to determine a sum of the differential currents that are measured by means of all differential current sensors, and to compare the sum with a further limit value and to recognize a case of the further limit value being exceeded likewise as a fault.

15. The inverter of claim 14, wherein the monitoring device is configured to determine a resistive fault current portion of the measured differential currents separately for each of the differential currents that are measured by means of one of the differential current sensors.

16. The inverter of claim 15, wherein the monitoring device is configured to compare the resistive fault current portion of each of the measured differential currents with the limit value.

17. The inverter of claim 14, wherein the monitoring device is configured to determine a capacitive leakage current portion of the measured differential currents separately for each of the differential currents that are measured by means of one of the differential current sensors.

18. The inverter of claim 17, wherein the monitoring device is configured to determine the sum of the capacitive leakage current portions of the differential currents in all of the at least two pairs of input lines and to compare this sum with the further limit value.

19. The inverter of claim 14, wherein the monitoring device is configured to determine a capacitive leakage current portion of the sum of the differential currents in all pairs of input lines and to compare this sum with the further limit value.

20. The inverter of claim 14, wherein each of the at least two pairs of input lines is configured to conduct the currents that are fed in at the connectors from at least two direct-current generators when coupled thereto, respectively.

21. A method of monitoring an inverter that comprises separate input-side connectors for multiple direct-current generators when coupled thereto with regard to the occurrence of a critical fault current, comprising:
transmitting within the inverter all currents that are fed in at the individual input-side connectors via at least two pairs of input lines that are separately conducting the currents that are fed in at different input-side connectors;

measuring within the inverter differential currents between the input lines separately for each of the at least two pairs of input lines using one or more measuring devices;

determining a sum of the differential currents simultaneously occurring in all of the at least two pairs of input lines using a monitoring device; and comparing the sum with a limit value, wherein a case of the limit value being exceeded is recognized as a fault using the monitoring device.

* * * * *